(12) United States Patent
Mikelson et al.

(10) Patent No.: US 7,022,247 B2
(45) Date of Patent: Apr. 4, 2006

(54) PROCESS TO FORM FINE FEATURES USING PHOTOLITHOGRAPHY AND PLASMA ETCHING

(75) Inventors: Hans Peter Mikelson, Eau Claire, WI (US); George James Lobos, Chetek, WI (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 185 days.

(21) Appl. No.: 10/397,614

(22) Filed: Mar. 26, 2003

(65) Prior Publication Data

US 2004/0188382 A1   Sep. 30, 2004

(51) Int. Cl.
*H01L 21/00* (2006.01)

(52) U.S. Cl. .................. 216/11; 216/22; 216/54; 430/5

(58) Field of Classification Search .......... 216/11, 216/22, 54; 430/5
See application file for complete search history.

(56) References Cited

U.S. PATENT DOCUMENTS

| | | | |
|---|---|---|---|
| 5,320,981 A * | 6/1994 | Blalock | 438/640 |
| 5,790,512 A | 8/1998 | Put et al. | |
| 6,190,989 B1 * | 2/2001 | Roberts | 438/396 |
| 6,333,456 B1 * | 12/2001 | Yanagimachi | 136/255 |
| 6,417,108 B1 * | 7/2002 | Akino et al. | 438/690 |
| 6,475,884 B1 * | 11/2002 | Hshieh et al. | 438/498 |
| 6,566,269 B1 * | 5/2003 | Biles et al. | 438/706 |
| 6,783,994 B1 * | 8/2004 | Rizzo et al. | 438/3 |
| 2001/0016385 A1 * | 8/2001 | Chiang et al. | 438/257 |
| 2002/0089787 A1 * | 7/2002 | Lu et al. | 360/235.1 |

* cited by examiner

*Primary Examiner*—Shamim Ahmed
(74) *Attorney, Agent, or Firm*—Jones Day (57) ABSTRACT

Methods of making a sharp pointed structure (19), such as a sharp pointed structure in a semiconductor, includes providing a substrate (14) and then depositing an oxide layer (16), such as silicon oxide or silicon nitride, on the substrate (14) and depositing a low contrast photoresist (17) on the oxide layer (16). The low contrast photoresist (17) is then exposed to optical energy through a reticle (21), with the reticle (21) having a partially triangular shape (22), such as an equilateral triangle with a tip. The low contrast photoresist (17) is developed and the oxide layer (16) is etched to form the sharp pointed structure (19). Additionally, a film is deposited (15), such as a magnetoresistive layer, between the substrate (14) and the oxide layer (16). The low contrast photoresist (17) is removed and the film (15) is etched to create a sharp pointed film structure (23) in the film (15).

20 Claims, 12 Drawing Sheets

PROCESS TO FORM FINE FEATURES USING PHOTOLITHOGRAPHY AND PLASMA ETCHING

FIELD OF THE PRESENT INVENTION

The present invention generally relates to a process to form fine features on a structure and more particularly to a process to form fine features such as a sharp corner or pointed feature, on an oxide layer and film layer, using photolithography and plasma etching.

BACKGROUND

During the manufacture of semiconductor devices, photoresist is used to form a pattern which is then transferred to a film, such as a magnetoresistive metal film, using an etch process. The resolution of the features of the photoresist pattern is limited by the optical exposure system. Near the limit of resolution of the optical exposure system, sharp corners and pointed structures may become rounded.

Others have used a high contrast photoresist to increase the resolution of the photoresist. The contrast of a photoresist is measured by the factor gamma. The value of gamma is defined as $[\log_{10} E_0/E_i]^{31\ 1}$, where $E_0$ is the energy where the exposed resist is completely removed and $E_i$ is the threshold energy where the exposed resist first exhibits significant removal. Typical values for gamma range from 1 to 10.

Others have employed a serif that can be used to reduce rounding of sharp corners in the photoresist.

Use of high contrast photoresist and serifs can eliminate much corner rounding that occurs in lithography. However, in the case of manufacturing a pointed end to a device, there is still significant rounding.

Manufacturing devices with very pointed ends is difficult to accomplish near the resolution limits of the optical exposure system. The uses of high contrast photoresist and serifs have been found to not transfer a pointed shape well to the underlying film.

Therefore, there is a need for novel methods to create sharp pointed structures.

Therefore, there is a further need for such novel methods to create sharp pointed structures in a semiconductor based structure.

Therefore, there is a further need for such novel methods to create sharp pointed structures in magnetoresistive metal film.

SUMMARY

The present invention solves these needs and other problems in the field of sharp pointed structure, such as a sharp corner, manufacturing methods by providing, in most preferred aspects, a method of making a sharp pointed structure including: providing a substrate; depositing an oxide layer on the substrate; depositing a low contrast photoresist on the oxide layer; exposing the low contrast photoresist to optical energy through a reticle, with the reticle having a partially triangular shape; developing the low contrast photoresist; and etching the oxide layer to form the sharp pointed structure.

In other aspects of the present invention, the method decontaminates the low contrast photoresist.

In other aspects of the present invention, the method decontaminates the low contrast photoresist with oxygen.

In other aspects of the present invention, the method provides a substrate in the form of a semiconductor.

In other aspects of the present invention, the method provides depositing an oxide layer in the form of a silicon dioxide layer on the substrate.

In other aspects of the present invention, the method deposits a silicon layer on the substrate.

In other aspects of the present invention, the method provides for a partially triangular shaped reticle with a tip.

In other aspects of the present invention, the method provides a partially equilateral triangular shaped reticle with a tip.

In other aspects of the present invention, a method of making a sharp pointed film structure is provided including: providing a substrate; depositing a film on the substrate; depositing an oxide layer on the film; depositing a low contrast photoresist on the oxide layer; exposing the low contrast photoresist to optical energy through a reticle with the reticle having a partially triangular shape; developing the low contrast photoresist; etching the oxide layer to form a sharp pointed structure in the oxide layer; removing the low contrast photoresist; and etching the film to form the sharp pointed film structure.

In other aspects of the present invention, the method deposits a metal film.

In other aspects of the present invention, the method provides for a magnetoresistive film.

It is an object of the present invention to provide a novel method of creating a sharp pointed structure.

It is a further object of the present invention to provide such a novel method of creating a sharp pointed structure on a semiconductor.

It is a further object of the present invention to provide such a novel method of creating a sharp pointed structure in a metal film.

It is a further object of the present invention to provide such a novel method of creating a sharp pointed structure in a magnetoresistive film.

These and further objects and advantages of the present invention will become clearer in light of the following detailed description of illustrative embodiments of this invention described in connection with the drawings.

DESCRIPTION OF THE DRAWINGS

The illustrative embodiments may best be described by reference to the accompanying drawings where.

All figures are drawn for ease of explanation of the basic teachings of the present invention only; the extensions of the figures with respect to number, position, relationship, and dimensions of the parts to form the preferred embodiments will be explained or will be within the skill of the art after the following description has been read and understood. Further, the exact dimensions and dimensional proportions to conform to specific current, voltage, capacitance, force, weight, strength, and similar requirements will likewise be within the skill of the art after the following description has been read and understood.

Where used in the various figures of the drawings, the same numerals designate the same or similar parts. Furthermore, when the terms "end," "bottom," "top," "first," "second," "left," "right" and similar terms are used herein, it should be understood that these terms have reference only to the structure shown in the drawings as it would appear to a person viewing the drawings and are utilized only to facilitate describing the illustrative embodiments.

DESCRIPTION OF THE PREFERRED EMBODIMENTS

A substrate used in the methods according to the preferred teachings of the present invention is shown in the drawings and generally designated 14. According to the preferred teachings of the present invention, the substrate 14 can be a semiconductor substrate, such as a silicon semiconductor substrate, and is suitable for the creation of semiconductor devices and electronic circuits. Those skilled in the art will recognize that any other material that is compatible with the methods of the present invention may be used to construct the substrate 14 and will be within the spirit and scope of the present invention. In general, underlying circuitry is fabricated using conventional methods and processes, employing one or more layers of conventional interconnects to produce a partially connected and partially functional front-end. The upper layer of the front-end is a material of a thickness sufficient for the designed purpose of an electronic circuit. This front-end is then used as the substrate 14 on which the specialized circuitry is fabricated.

FIGS. 1A–1D show a cross section of a structure with a sharp pointed structure 19 in an oxide layer 16. According to the preferred teachings of the present invention the sharp pointed structure 19 can be an element of a bit structure 29 shown in FIG. 6B. Methods to construct pointed ends on a structure where the size of the pointed ends is near the limit of resolution of an optical exposure system start by providing the substrate 14 as diagrammatically illustrated by a box 20 in FIG. 7. The oxide layer 16 is deposited on the substrate 14 using techniques well known in the art as diagrammatically illustrated by box 30. According to the preferred teachings of the present invention, the oxide layer 16 can be a silicon dioxide layer. In an alternate embodiment according to the preferred teachings of the present invention, the oxide layer 16 can be a silicon nitride layer. Those skilled in the art will recognize that any other material that is compatible with the methods of the present invention may be used to construct the oxide layer 16 and will be within the spirit and scope of the present invention. For example, a nitric oxide layer may be deposited on the substrate layer instead of the example silicon dioxide layer.

On top of the oxide layer 16 is deposited a low contrast photoresist 17 using techniques well know in the art as diagrammatically illustrated by box 40. According to the preferred teachings of the present invention, the low contrast photoresist 17 can be a standard low contrast photoresist. Those skilled in the art will recognize that any other material, compatible with the methods of the present invention, may be used to construct the low contrast photoresist 17 and will be within the spirit and scope of the present invention. The combination of the low contrast photoresist 17 with an etch process that is highly selective to the material being etched enables the creation of the sharp pointed structure 19 that, according to the preferred teachings of the present invention, is a sharp corner.

The low contrast photoresist 17 is exposed to optical energy through a reticle 21, creating the shape of the desired top cross section of the structure to be created, as diagrammatically illustrated by box 50. The reticle 21 has a partially triangular shape 22 with a tip. According to the preferred teachings of the present invention, the partially triangular shape 22 forms a partial equilateral triangle with a tip. According to the preferred teachings of the present invention, the low contrast photoresist 17 is exposed to 90 millijoules of optical energy. According to the preferred teachings of the present invention, the optical frequency corresponds to a G or I line stepper, in the blue light range, of approximately 90 millijoules, +/−5 millijoules for a 0.9 micron film. The layer of low contrast photoresist 17 is exposed to light of this frequency and for the appropriate duration to provide the correct amount of energy to the layer of low contrast photoresist 17 that, according to the preferred teachings of the present invention, is a low contrast photoresist film. Those skilled in the art will recognize that the exposure time is a direct function of the optical frequency to deliver a prescribed amount of energy.

The low contrast photoresist 17 is then developed to leave a foot 18 of the low contrast photoresist 17 in the area of the sharp pointed structure 19 as diagrammatically illustrated by box 60. The low contrast photoresist 17 is developed using a developer that dissolves the weakly acidic exposed low contrast photoresist 17.

The oxide layer 16 is etched using an anisotropic etch process which etches the oxide layer 16 selectively to the low contrast photoresist 17 as diagrammatically illustrated by box 80. During the anisotropic etch process, slight erosion of the foot 18 causes the sharp pointed structure 19 at the end to become more pointed. The methods of the present invention significantly improves the transfer of a pointed shape or sharp corners from the low contrast photoresist 17 to a structure, the oxide layer 16, whose dimensions are near the limit of an optical exposure system.

FIGS. 2A–2E show a cross section of a structure with the sharp pointed structure 19 in the oxide layer 16 where a decontamination procedure has removed photoresist residue 27. Methods to construct pointed ends on a structure where the size of the pointed ends is near the limit of resolution of an optical exposure system with a decontamination procedure start by providing the substrate 14 as diagrammatically illustrated by box 20 in FIG. 8. Methods of FIG. 8 generally proceed as the methods of FIG. 7 with the addition of a decontamination procedure. An oxide layer 16 is deposited as diagrammatically shown in box 30. The low contrast photoresist 17 is deposited on the oxide layer 16 as diagrammatically shown in box 40. The low contrast photoresist 17 is exposed to optical energy as diagrammatically shown in box 50. The low contrast photoresist 17 is developed as diagrammatically shown in box 60.

In the alternate embodiment according to the preferred teachings of the present invention, the developed low contrast photoresist 17 is decontaminated to remove any photoresist residue 27 that may remain as diagrammatically illustrated by box 70. According to the preferred teachings of the present invention, oxygen is introduced into the plasma to perform the decontamination procedure, also known as the descum procedure as is well known in the art. As is known in the art, the low contrast photoresist 17 may be cured by heating it to an appropriate temperature to strengthen polymeric bonding in the low contrast photoresist 17. During a test run, wafers showed a small amount of photoresist residue 27. The wafers with 10% overetch and no descum procedure show some amount of photoresist residue 27. The other wafers do not have photoresist residue 27 except possibly at the 80 mJ/cm² dose. Wafers exposed at 80 mJ/cm² all have bridging. Wafers exposed at 90 mJ/cm² have pointed structures and have some rough edges in some cases. Wafers exposed at 100 and 110 mJ/cm² do not have very pointed structures. The best-looking result from experiment was the one with a descum procedure and a 10% overetch exposed at 90 mJ/cm².

Table A summaries results of decontamination on Critical Dimensions, CD, that are either a bit structure width or a bit structure length for the bit structure 29. The CD measurements indicated that the descum procedure reduced the CD by as much as 0.5 um in the 90 mJ/cm² exposure case. Only 0.09–0.18 um loss of width was due to the descum procedure. CD change in going from 10% overetch to 40% overetch was less than 0.1 um.

TABLE A

| Wafer | Site | Dose (milli Joules) | Descum | Overetch | Bit Length (microns) | Bit Width (microns) |
|---|---|---|---|---|---|---|
| 2 | 5 | 110 | 0 | 10% | 2.44 | .66 |
|   | 6 | 100 | 0 | 10% | 2.68 | .68 |
|   | 7 | 90 | 0 | 10% | 3.11 | .72 |
| 3 | 5 | 110 | 500 | 10% | 2.28 | .53 |
|   | 6 | 100 | 500 | 10% | 2.35 | .59 |
|   | 7 | 90 | 500 | 10% | 2.72 | .60 |
| 4 | 5 | 110 | 0 | 40% | 2.35 | .59 |
|   | 6 | 100 | 0 | 40% | 2.59 | .62 |
|   | 7 | 90 | 0 | 40% | 3.17 | .70 |
| 6 | 5 | 110 | 500 | 40% | 2.23 | .52 |
|   | 6 | 100 | 500 | 40% | 2.37 | .54 |
|   | 7 | 90 | 500 | 40% | 2.56 | .46 |

| Effect | Dose | ΔLength | ΔWidth |
|---|---|---|---|
| Overetch | 110 | .07 | .04 |
|   | 100 | .04 | .05 |
|   | 90 | .05 | .09 |

TABLE A-continued

| Effect | Dose | ΔLength | ΔWidth |
|---|---|---|---|
| Descum | 110 | .14 | .10 |
|   | 100 | .28 | .09 |
|   | 90 | .50 | .18 |

Figure 8:
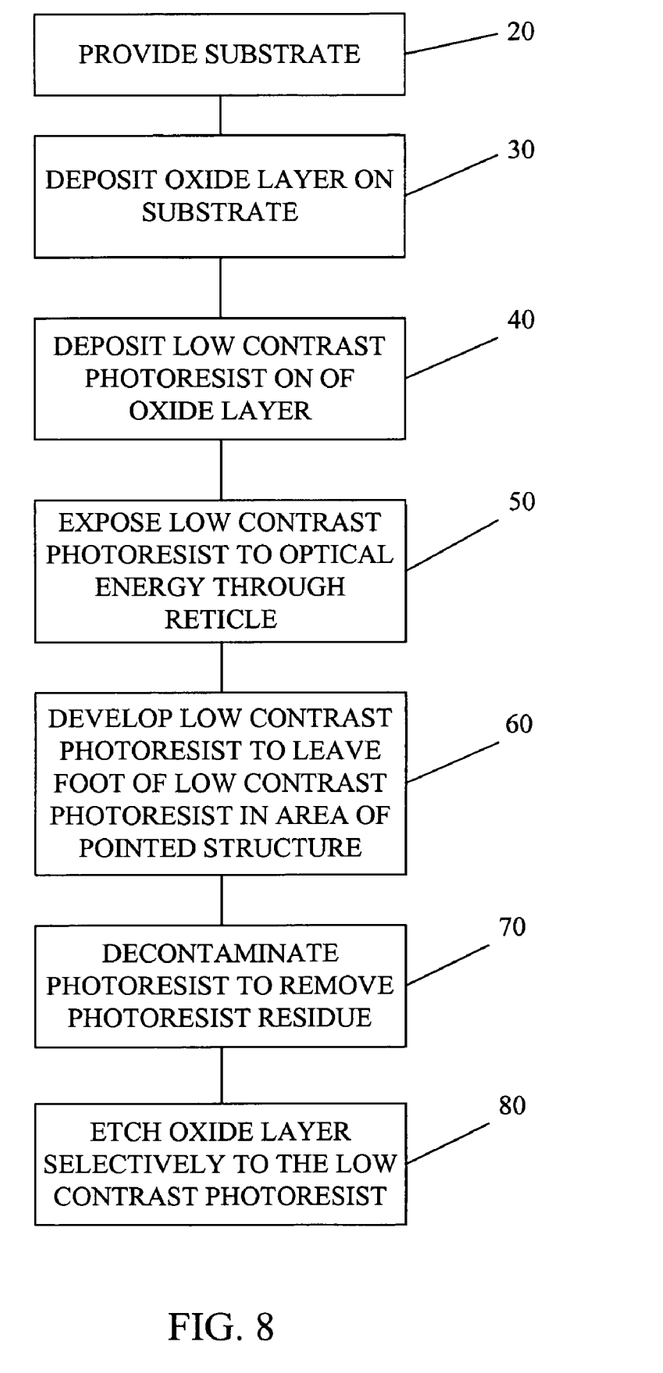
FIG. 8 shows a process flow diagram of methods according to the preferred teachings of the present invention to form sharp corners and pointed features on a structure with decontamination.

Δ Length is the change in length of the CD, and Δ Width is the change in width of the CD. These deltas are measured CD variations from CD measurements at the photoresist 17. Small differences mean a good transfer of the photoresist 17 pattern to bit geometry. Next, the oxide layer 16 is etched using an anisotropic etch process which etches the oxide layer 16 selectively to the low contrast photoresist 17 as diagrammatically illustrated by box 80. The methods of the present invention significantly improve the transfer of a pointed shape or sharp corners from low contrast photoresist 17 to a structure whose dimensions are near the limit of an optical exposure system.

Figure 1A:
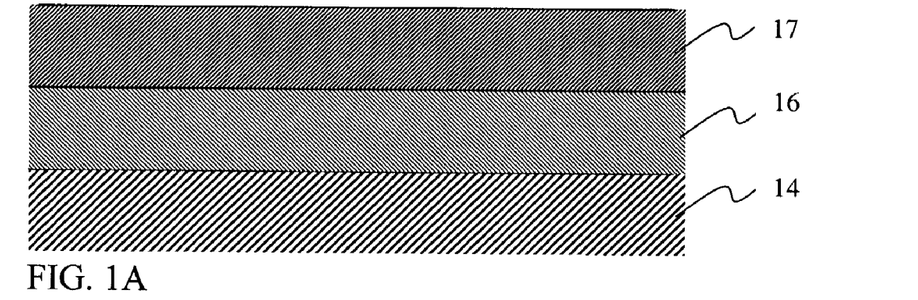
FIGS. 1A–1D each shows a cross section of a substrate with a film, an oxide layer and low contrast photoresist as processed following the methods according to the preferred teachings of the present invention to create a sharp structure.
Figure 1B:
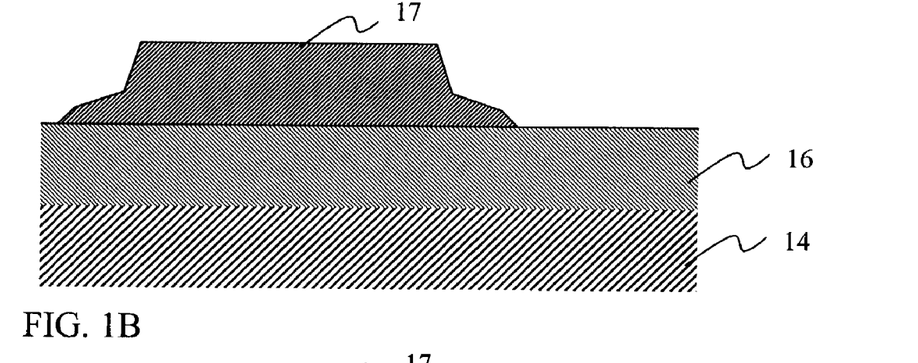
Figure 1C:
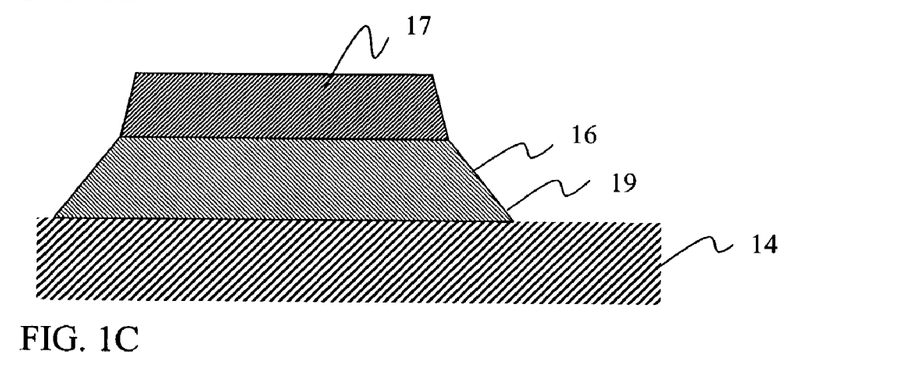
Figure 1D:
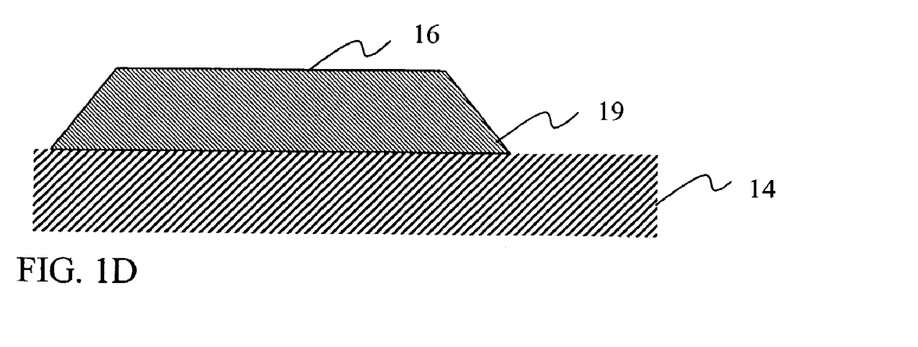
Figure 2A:
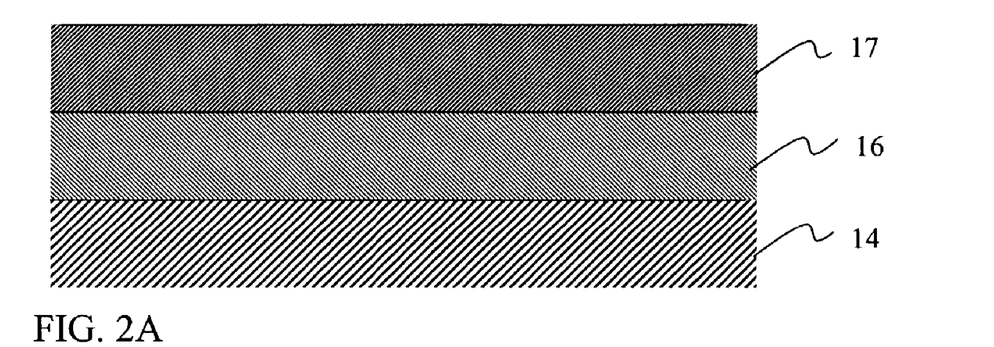
FIGS. 2A–2E each shows a cross section of a substrate with a film, an oxide layer and a low contrast photoresist as processed following the methods according to the preferred teachings of the present invention to create a sharp structure with decontamination.
Figure 2B:
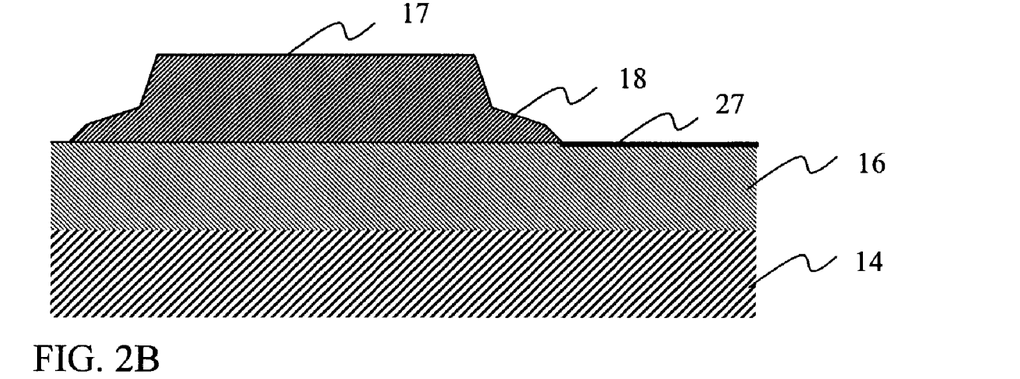
Figure 2C:
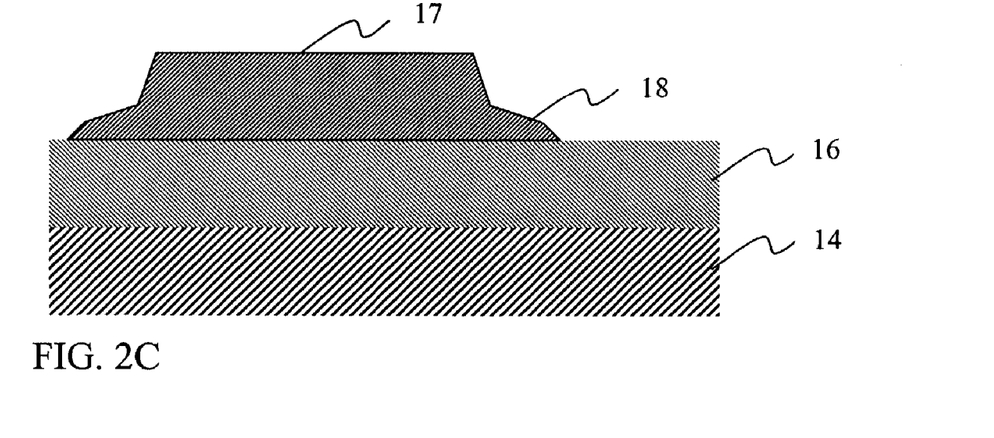
Figure 2D:
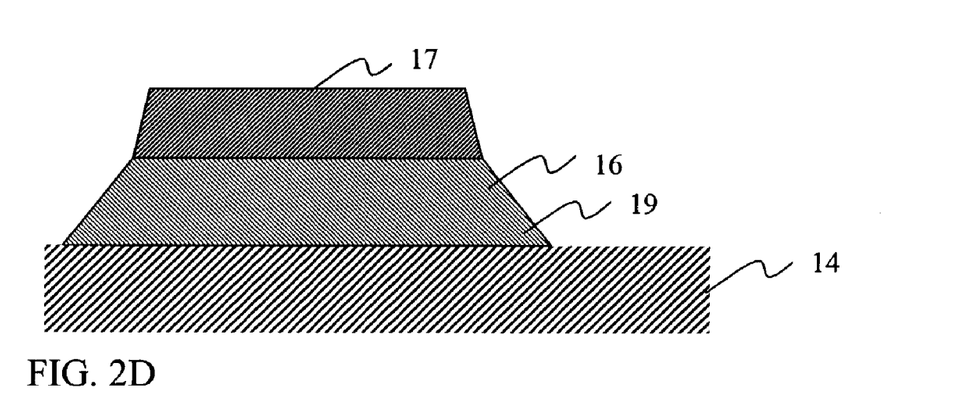
Figure 2E:
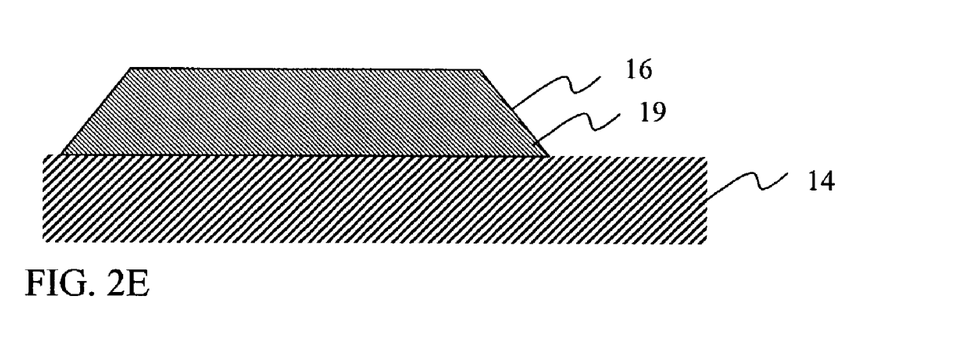
Figure 3A:
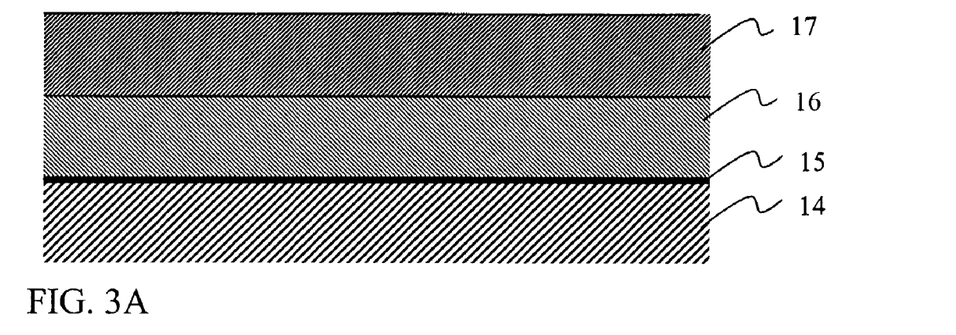
FIGS. 3A–3E each shows a cross section of a substrate with a film, an oxide layer and low contrast photoresist as processed following the methods according to the preferred teachings of the present invention to create a sharp structure and a sharp structure on a film.
Figure 3B:
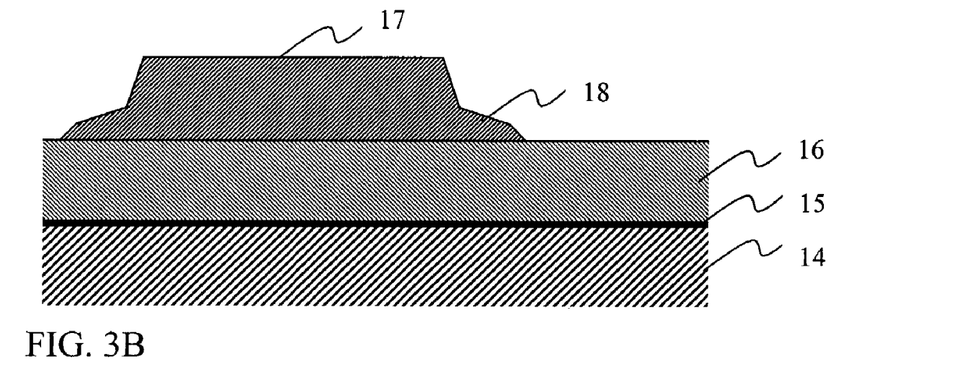
Figure 3C:
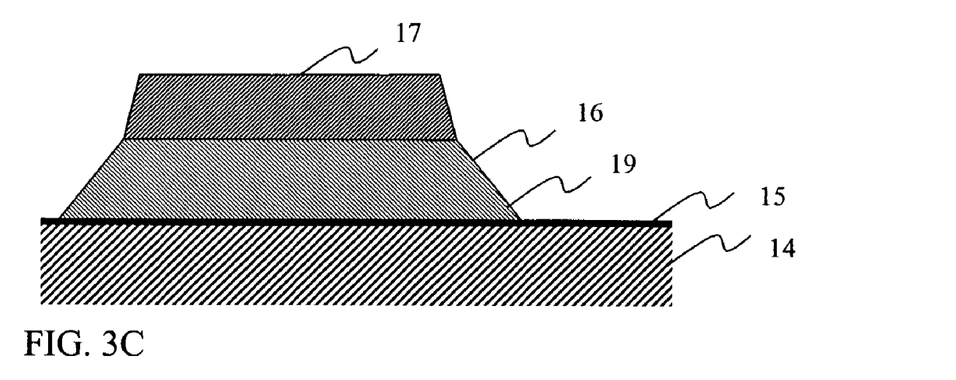
Figure 3D:
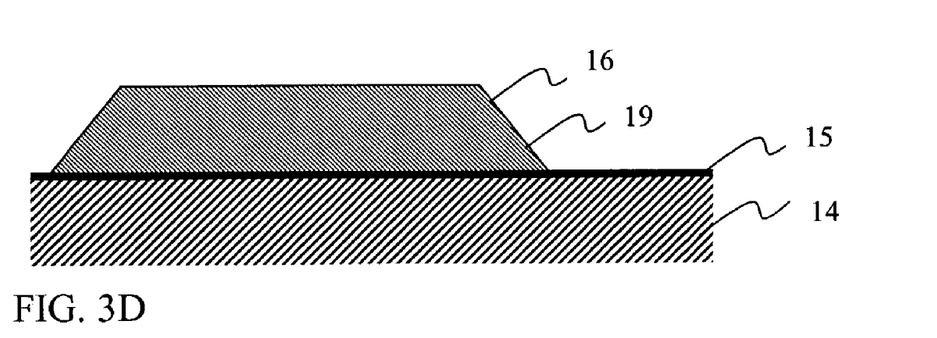
Figure 3E:
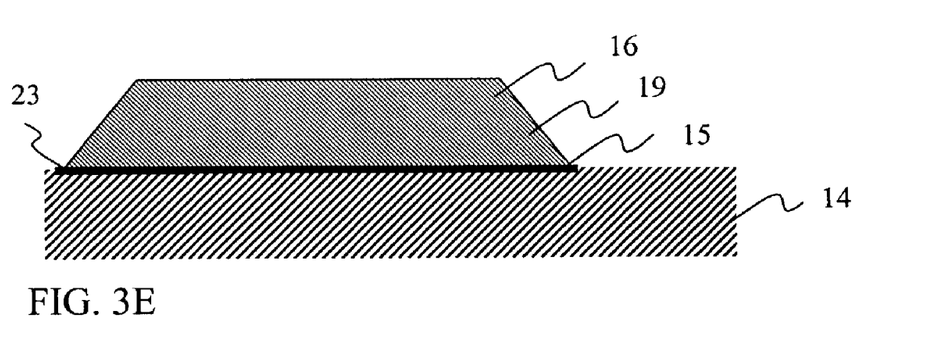
Figure 4A:
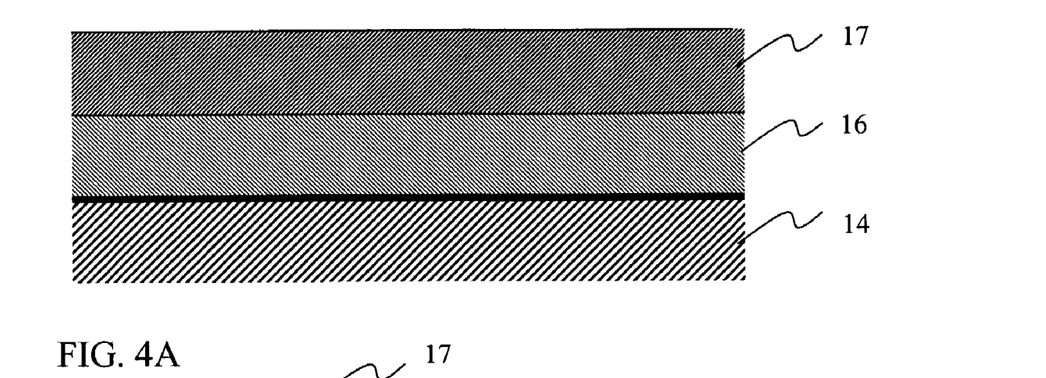
FIGS. 4A–4F each shows a cross section of a substrate with a film, low contrast photoresist with an oxide layer having a sharp structure as processed following the methods according to the preferred teachings of the present invention.
Figure 4B:
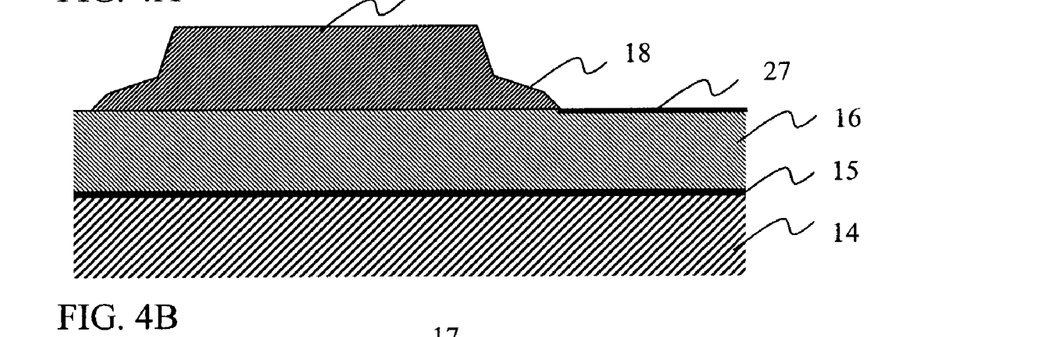
Figure 4C:
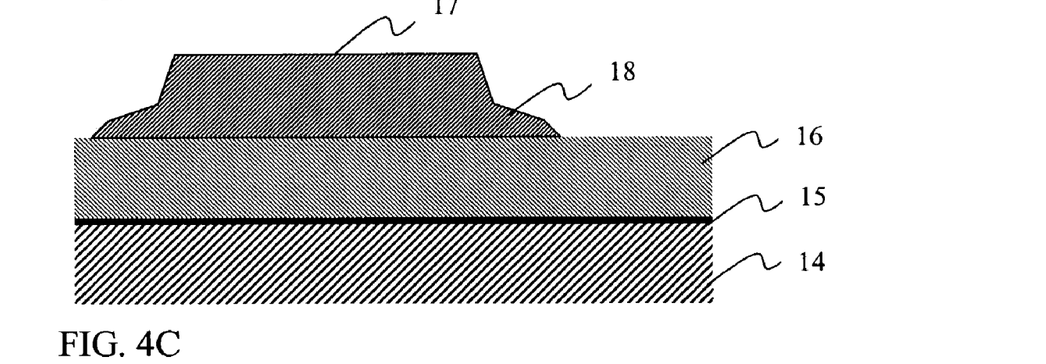
Figure 4D:
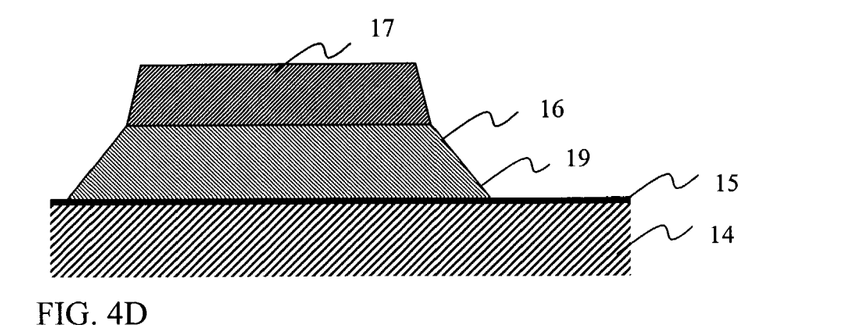
Figure 4E:
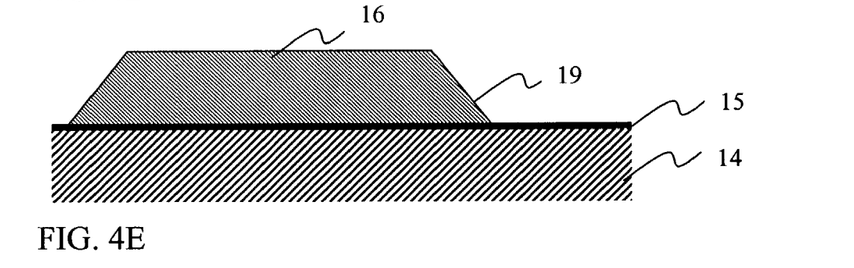
Figure 4F:
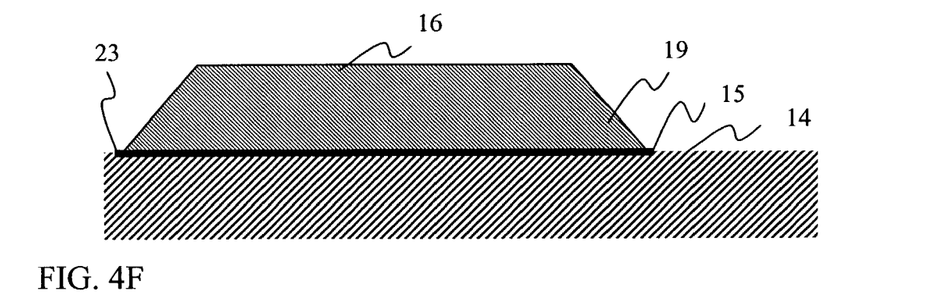
Figure 5:
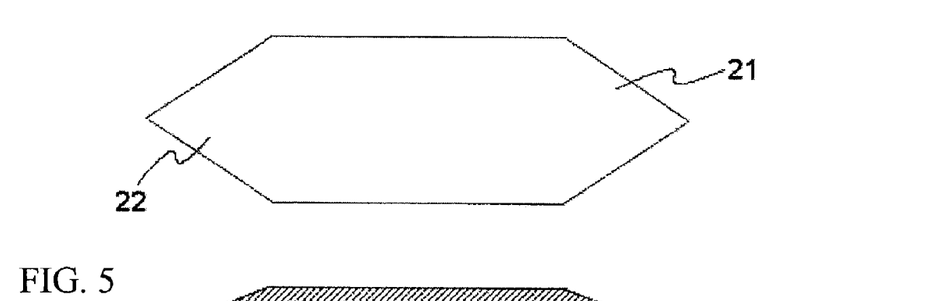
FIG. 5 shows a reticle having a triangular shape with a tip according to the preferred teachings of the present invention.
Figure 6A:
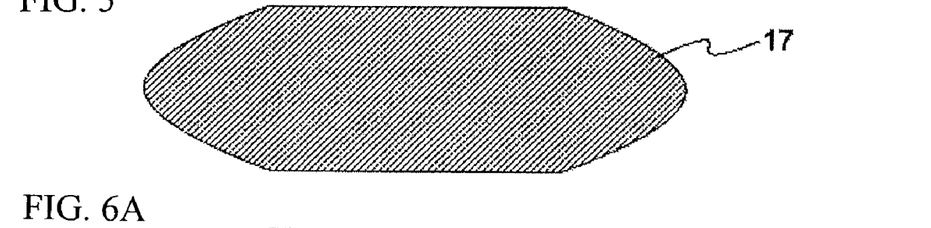
FIG. 6A shows a low contrast photoresist pattern according to the preferred teachings of the present invention.
Figure 6B:
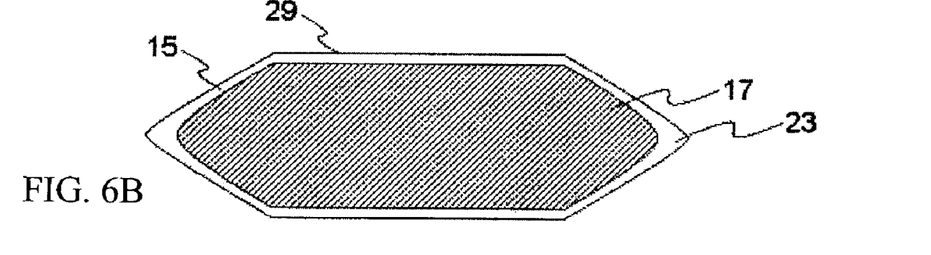
FIG. 6B shows an oxide layer and low contrast photoresist after etch.
Figure 7:
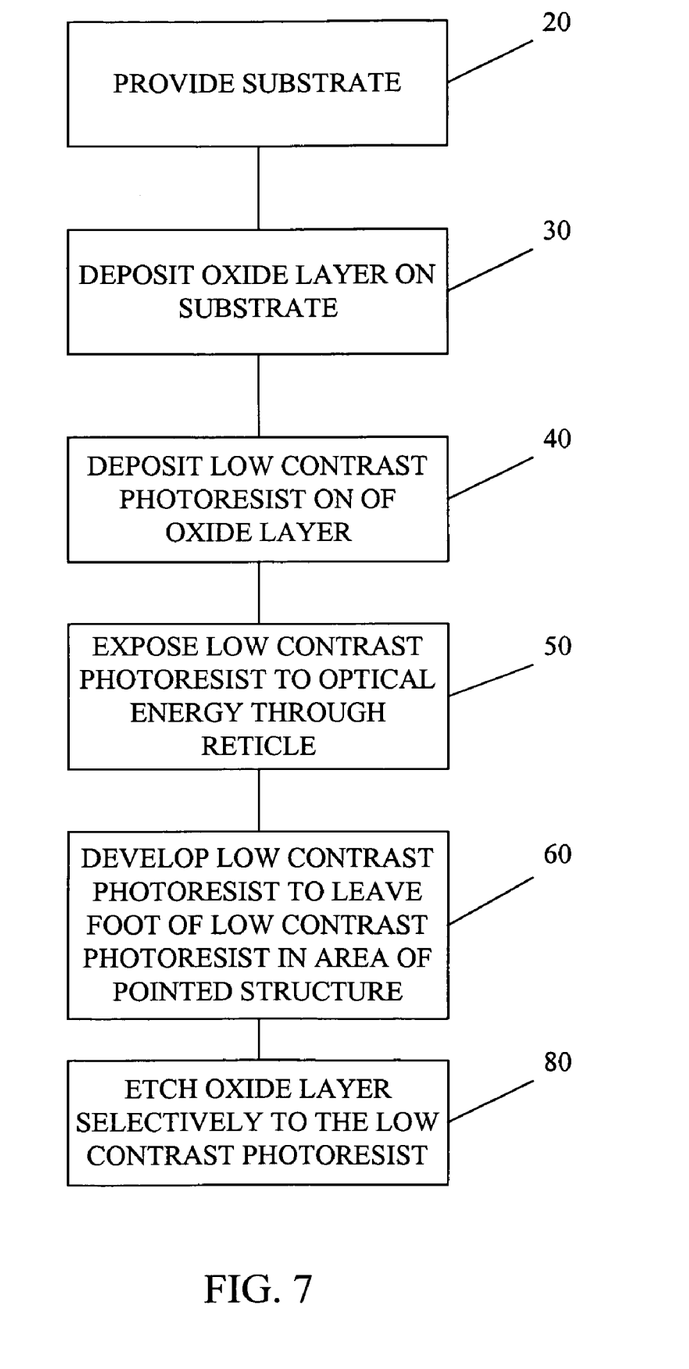
FIG. 7 shows a process flow diagram of methods according to the preferred teachings of the present invention to form sharp corners and pointed features on a structure.
Figure 9:
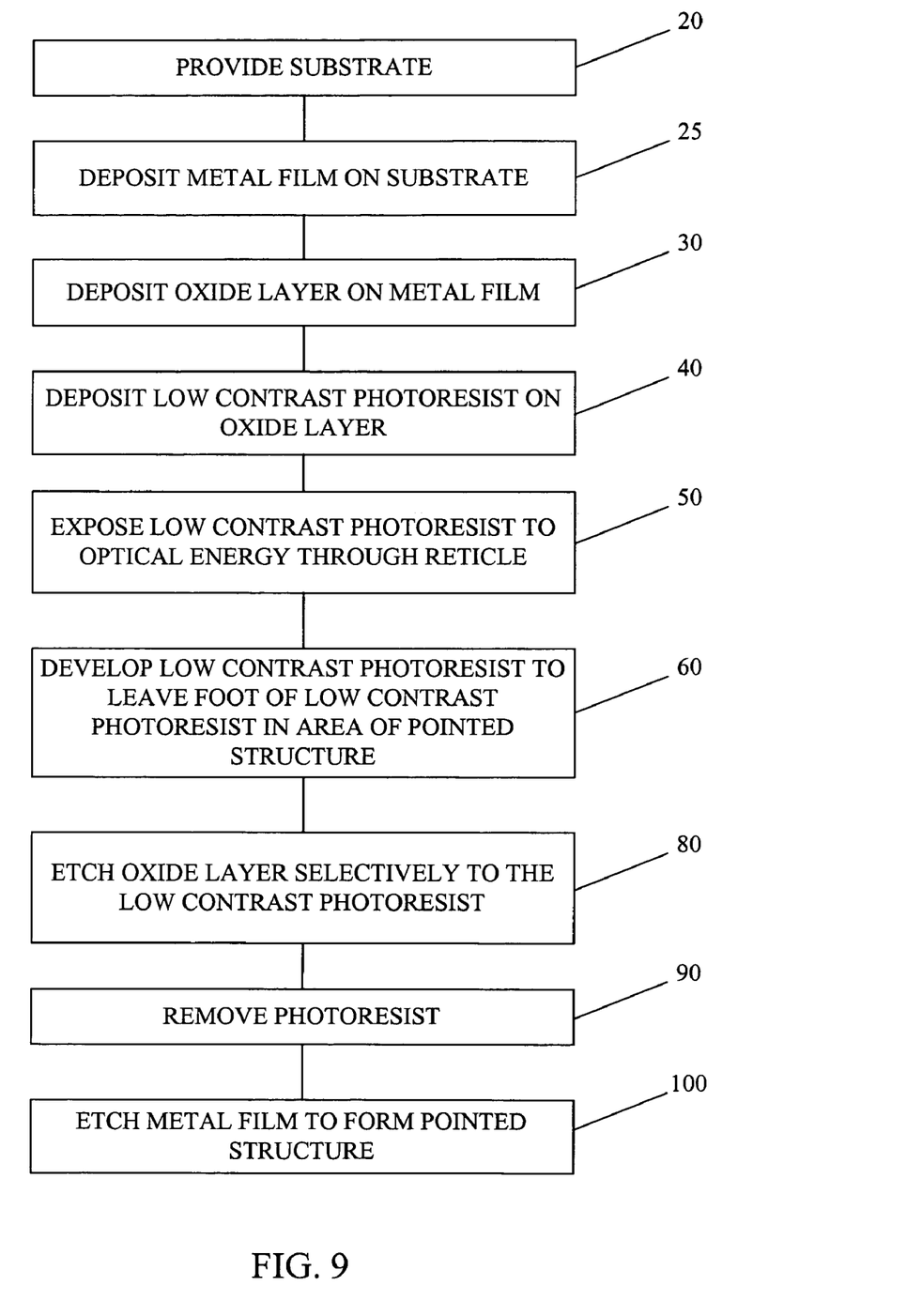
FIG. 9 shows a process flow diagram of methods according to the preferred teachings of the present invention to form sharp corners and pointed features on a structure and a film.

FIGS. 3A–3E show a cross section of a structure with the sharp pointed structure 19 in the oxide layer 16 and a sharp pointed film structure 23 in a film 15 forming the bit structure 29 as shown in FIG. 6B. Methods to construct pointed ends on a structure and a film where the size of the pointed ends is near the limit of resolution of an optical exposure system with a decontamination procedure start by providing the substrate 14 as diagrammatically illustrated by box 20 in FIG. 9. Methods of FIG. 9 generally proceed as the methods of FIG. 7 with the addition of the film 15 between the substrate 14 and the oxide layer 16.

On top of the substrate 14 is deposited the film 15 of material that is constructed using techniques well known in the art as diagrammatically illustrated by box 25. According to the preferred teachings of the present invention, the film 15 is a metal film such as a 100 angstrom metal film made from a magnetoresistive material, also known as a magnetoresistive metal film. In an alternate embodiment according to the preferred teachings of the present invention, the film 15 can be aluminum, gold, or any other compatible metal. Those skilled in the art will recognize that any other material that is compatible with the methods of the present invention may be used to construct the film 15 and will be within the spirit and scope of the present invention.

Magnetoresistive random access memory elements (MRAM) rely on layers of magnetic film to store information. The shape of this structure is critical in the performance of this type of device. A structure with pointed ends results in better switching characteristics compared to a structure with flat ends. This is because the pointed end can prevent trapping magnetic domains in the device, which may alter the switch thresholds and signal strength of the device. In alternative embodiments according to the preferred teachings of the present invention, the processes are useful for the fabrication of a variety of active and passive circuit elements. These generic circuit elements are referred to as metal structures, which include, but are not limited to, a variety of magnetic devices.

The oxide layer 16 is deposited as diagrammatically shown in box 30. The low contrast photoresist 17 is deposited on the oxide layer 16 as diagrammatically shown in box 40. The low contrast photoresist 17 is exposed to optical energy as diagrammatically shown in box 50. The low contrast photoresist 17 is developed as diagrammatically shown in box 60.

The oxide layer 16 is etched using an anisotropic etch process which etches the oxide layer 16 selectively to the low contrast photoresist 17 as diagrammatically illustrated by box 80. During the anisotropic etch process, slight erosion of the foot 18 causes the sharp pointed structure 19 at the end to become more pointed. The methods of the present invention significantly improves the transfer of a pointed shape or sharp corners from the low contrast photoresist 17 to a structure whose dimensions are near the limit of an optical exposure system. CD's were measured at five sites on a wafer processed with the methods of the present invention. The negative CD change indicates that the CD's were larger after etch. When low contrast photoresist 17 is exposed near the limit of its exposure dose, the foot 18 can be formed at the pointed tip of the structure following the preferred teachings of the present invention. The foot 18 plays a critical role in the creation of the bit structure 29. As the low contrast photoresist 17 is slowly etched away over this point, a very sharply pointed structure, the sharp pointed structure 19, is created. There is some photoresist residue 27 on top of the oxide layer 16 that, according to the preferred teachings of the present invention, is a bit hardmask oxide layer. The photoresist residue 27 was mostly affected by the UV cure vs. hardbake parameter. There is some photoresist residue 27 in the field at the bit ends. This was mostly effected by the amount of overetch with a long overetch clearing this photoresist residue 27. The type of photoresist has the greatest effect on bit end shape. The low contrast photoresist 17 results in a more pointed bit shape. Wafer experiment# 5 has the best overall process from this set except for the photoresist residue 27 on the bits. Wafer experiment# 7 has the least photoresist residue 27 on the bit hardmask oxide.

The low contrast photoresist 17 is removed in a well-known manner as is diagrammatically shown in box 90. This exposes the oxide layer 16 to further processing.

The film 15 is then etched to form the sharp pointed film structure 23 as is diagrammatically shown in box 100.

Figure 10:
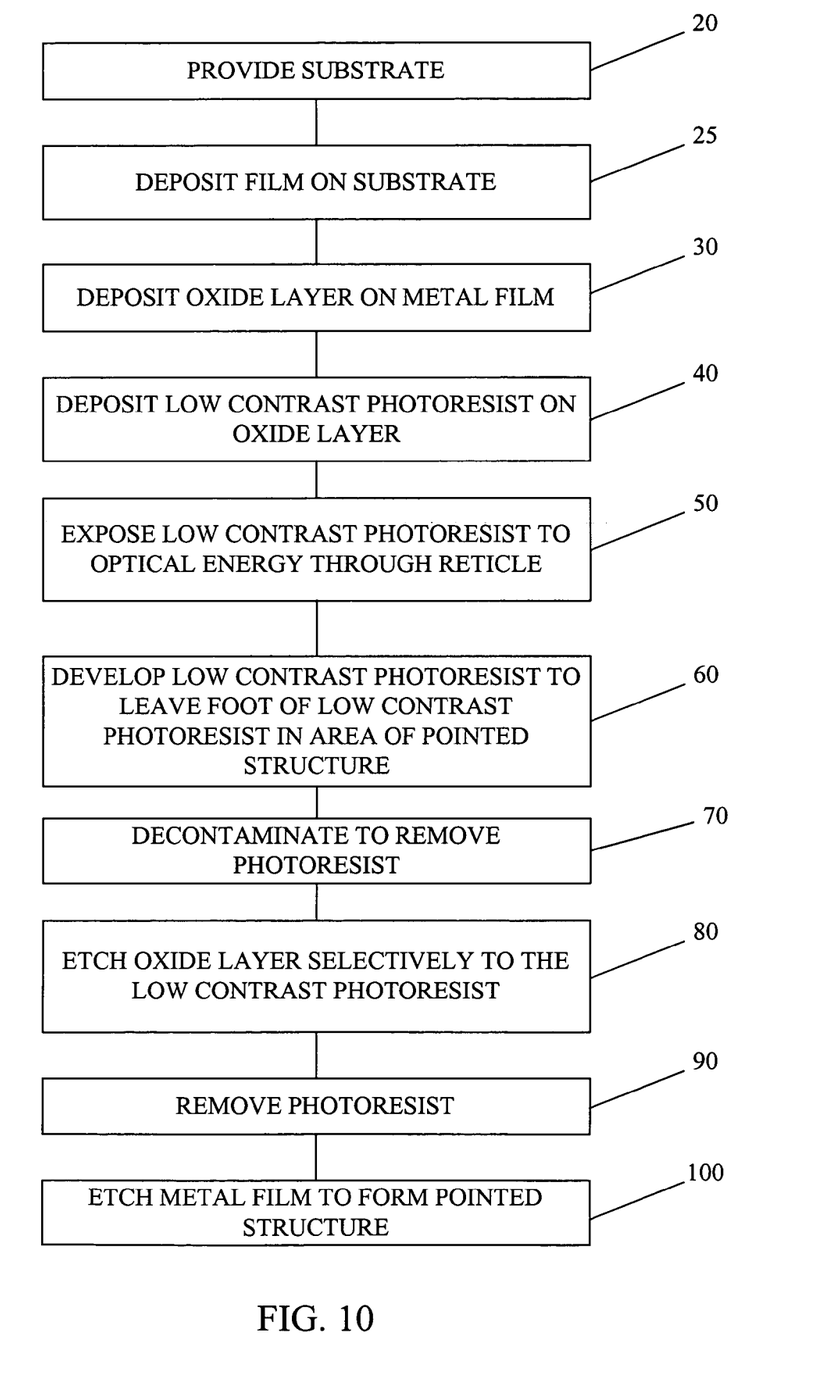
FIG. 10 shows a process flow diagram of methods according to the preferred teachings of the present invention to form sharp corners and pointed features on a structure and a film that includes a decontamination procedure.

FIGS. 4A–4F show a cross section of a structure with the sharp pointed structure 19 in the oxide layer 16 and the sharp pointed film structure 23 in the film 15 where a decontamination procedure has removed photoresist residue 27. Methods to construct pointed ends on a structure and the film 15 where the size of the sharp pointed film structure 23 is near the limit of resolution of an optical exposure system start by providing the substrate 14 as diagrammatically illustrated by box 20 in FIG. 10. On top of the substrate 14 is deposited the film 15 of material that is constructed using techniques well known in the art as diagrammatically illustrated by box 25.

The oxide layer 16 is deposited on the film 15 using techniques well know in the art as diagrammatically illustrated by box 30. On top of the oxide layer 16 is deposited the low contrast photoresist 17 using techniques well know in the art as diagrammatically illustrated by box 40. The combination of the low contrast photoresist 17 with an etch process which is highly selective to the material being etched, the oxide layer 16, over low contrast photoresist 17 enables the creation of the sharp pointed structure 19 as a sharp corner.

The low contrast photoresist 17 is exposed to optical energy through a reticle 21, with the photomask creating the shape of the desired top cross section of the structure to be created, as diagrammatically illustrated by box 50. The low contrast photoresist 17 is then developed to leave the foot 18 of low contrast photoresist 17 in the area of the sharp pointed structure 19 at the end as diagrammatically illustrated by box 60.

In an alternate embodiment according to the preferred teachings of the present invention, the developed low contrast photoresist 17 is then decontaminated to remove any photoresist residue 27 that may remain as diagrammatically illustrated by box 70. The oxide layer 16 is etched using an anisotropic etch process which etches the oxide layer 16 selectively to the low contrast photoresist 17 as diagrammatically illustrated by box 80.

The low contrast photoresist 17 is removed in a well-known manner as is diagrammatically shown in box 90. This exposes the oxide layer 16 to further processing.

The film 15 is then etched to form the sharp pointed film structure 23 as is diagrammatically shown in box 100.

TABLE B

| Exp # | Resist | UV Cure | Se-lec-tivity | OE | Avg Norm* CD Bit 2 | Avg Norm* CD Bit 6 | Std Dev Bits 2 & 6 | CD Change Bits 2 & 6 |
|---|---|---|---|---|---|---|---|---|
| 1 | 7908 | UV | 7:1 | 20 | 2.598 | 3.702 | .0883 | −.118 |
|   |      |    |     |    |       |       | .0601 | −.102 |
| 2 | 7908 | UV | 15:1 | 40 | 2.642 | 3.720 | .0767 | −.122 |
|   |      |    |     |    |       |       | .0828 | −.100 |
| 3 | 7908 | HB | 7:1 | 40 | 2.626 | 3.645 | .0471 | −.106 |
|   |      |    |     |    |       |       | .0880 | .015 |
| 4 | 7908 | HB | 15:1 | 20 | 2.760 | 3.893 | .0659 | −.240 |
|   |      |    |     |    |       |       | .1038 | −.243 |
| 5 | 3312 | UV | 7:1 | 40 | 2.473 | 3.552 | .0666 | −.073 |
|   |      |    |     |    |       |       | .0561 | −.052 |
| 6 | 3312 | UV | 15:1 | 20 | 2.481 | 3.696 | .0794 | −.051 |
|   |      |    |     |    |       |       | .1562 | −.256 |
| 7 | 3312 | HB | 7:1 | 20 | 2.667 | 3.659 | .0630 | −.227 |
|   |      |    |     |    |       |       | .0899 | −.149 |

*Normalized to the pitch of the device.

Thus since the present invention disclosed herein may be embodied in other specific forms without departing from the spirit or general characteristics thereof, some of which forms have been indicated, the embodiments described herein are to be considered in all respects illustrative and not restrictive. The scope of the present invention is to be indicated by the appended claims, rather than by the foregoing description, and all changes which come within the meaning and range of equivalency of the claims are intended to be embraced therein.

The invention claimed is:

1. Method of making a sharp pointed structure comprising:
   providing a substrate;
   depositing an oxide layer on the substrate;
   depositing a low contrast photoresist on the oxide layer;
   exposing the low contrast photoresist to optical energy through a reticle with the reticle having a partially triangular shape;
   developing the low contrast photoresist to leave a foot structure of the low contrast photoresist in the desired area of the sharp pointed structure; and
   etching the oxide layer to form the sharp pointed structure, wherein the etching erodes the foot structure of the low contrast photoresist to cause formation of the sharp pointed structure.

2. The method of claim 1 with developing the low contrast photoresist including decontaminating the low contrast photoresist.

3. The method of claim 1 with developing the low contrast photoresist including decontaminating the low contrast photoresist with oxygen.

4. The method of claim 1 with providing the substrate comprising providing the substrate in the form of a semiconductor.

5. The method of claim 1 with depositing the oxide layer on the substrate comprising depositing a silicon dioxide layer on the substrate.

6. The method of claim 1 with depositing the oxide layer on the substrate comprising depositing a silicon nitride layer on the substrate.

7. The method of claim 6 with exposing the low contrast photoresist comprising exposing the low contrast photoresist to optical energy through the reticle having a partially triangular shape with a tip.

8. The method of claim 1 with exposing the low contrast photoresist comprising exposing the low contrast photoresist to optical energy through the reticle having a partially triangular shape with a tip.

9. The method of claim 1 wit exposing the low contrast photoresist comprising exposing the low contrast photoresist to optical energy through the reticle having a partially equilateral triangular shape with a tip.

10. Method of making a sharp pointed film structure comprising:
    providing a substrate;
    depositing a film on the substrate;
    depositing an oxide layer on the film;
    depositing a low contrast photoresist on the oxide layer;
    exposing the low contrast photoresist to optical energy through a reticle, with the reticle having a partially triangular shape;
    developing the low contrast photoresist to leave a foot structure of the low contrast photoresist in the desired area of the sharp pointed film structure;
    etching the oxide layer to erode the foot structure of the low contrast photoresist to cause formation of a sharp pointed structure in the oxide layer;
    removing the low contrast photoresist; and
    etching the film to form the sharp pointed film structure.

11. The method of claim 10 with depositing the film comprising depositing a metal film.

12. The method of claim 10 with depositing the film comprising depositing a magnetoresistive film.

13. The method of claim 10 with developing the low contrast photoresist including decontaminating the low contrast photoresist.

14. The method of claim 10 with developing the low contrast photoresist including decontaminating the low contrast photoresist wit oxygen.

15. The method of claim 10 with providing the substrate comprising providing the substrate in the form of a semiconductor.

16. The method of claim 10 with depositing the oxide layer on the substrate comprising depositing a silicon dioxide layer on the substrate.

17. The method of claim 16 with exposing the low contrast photoresist comprising exposing the low contrast photoresist to optical energy through the reticle having a partially triangular shape with a tip.

18. The method of claim 10 depositing the oxide layer on the substrate comprising depositing a nitric oxide layer on the substrate.

19. The method of claim 10 with exposing the low contrast photoresist comprising exposing the low contrast photoresist to optical energy through the reticle having a partially triangular shape with a tip.

20. The method of claim 10 with exposing the low contrast photoresist comprising exposing the low contrast photoresist to optical energy through the reticle having a partially equilateral triangular shape with a tip.

* * * * *

UNITED STATES PATENT AND TRADEMARK OFFICE
CERTIFICATE OF CORRECTION

| | | |
|---|---|---|
| PATENT NO. | : 7,022,247 B2 | Page 1 of 1 |
| APPLICATION NO. | : 10/397614 | |
| DATED | : April 4, 2006 | |
| INVENTOR(S) | : Mikelson et al. | |

It is certified that error appears in the above-identified patent and that said Letters Patent is hereby corrected as shown below:

Column 9,
Line 1, delete "wit" and insert -- with --.

Column 10,
Line 3, delete "wit" and insert -- with --.

Signed and Sealed this

Twenty-seventh Day of June, 2006

JON W. DUDAS
*Director of the United States Patent and Trademark Office*